United States Patent [19]

Frister et al.

[11] 4,347,543

[45] Aug. 31, 1982

[54] RECTIFIER CIRCUIT DIODE ARRAY AND CIRCUIT PROTECTOR

[75] Inventors: Manfred Frister, Schwieberdingen; Friedhelm Meyer, Illingen, both of Fed. Rep. of Germany

[73] Assignee: Robert Bosch GmbH, Stuttgart, Fed. Rep. of Germany

[21] Appl. No.: 214,516

[22] Filed: Dec. 9, 1980

[30] Foreign Application Priority Data

Dec. 13, 1979 [DE] Fed. Rep. of Germany ....... 2950073

[51] Int. Cl.³ .............................................. H02H 3/20
[52] U.S. Cl. .................................. 361/91; 310/68 D; 357/76; 363/53; 363/141
[58] Field of Search ................... 361/91, 56; 363/141, 363/145, 53; 323/907, 231; 322/28, 33, DIG. 1; 310/68 D; 357/76

[56] References Cited

U.S. PATENT DOCUMENTS 3,689,826  9/1972  Cherry .................. 310/68 D X
3,980,931  9/1976  McLellan ................. 361/91 X

FOREIGN PATENT DOCUMENTS 2014360  8/1979  United Kingdom .................. 357/76

*Primary Examiner*—Reinhard J. Eisenzopf
*Attorney, Agent, or Firm*—Frishauf, Holtz, Goodman and Woodward

[57] ABSTRACT

In a rectifier circuit structure, particularly for automative use, a diode array is in the form of a column and includes a Zener diode in the column which serves to protect the rectifier diodes of the arrangement and to protect an electrical load system coupled to the output of the diode array.

8 Claims, 3 Drawing Figures

RECTIFIER CIRCUIT DIODE ARRAY AND CIRCUIT PROTECTOR

The present invention relates to a diode array and circuit protection arrangement for a rectifier circuit having a cooling device, the diodes being disposed in the form of a column, and intended in particular for use in alternating-current generators in motor vehicles.

BACKGROUND AND PRIOR ART

A diode array of this general type is known from German Disclosure Document DE-OS No. 27 55 404.7. In this known diode array, a diode is inserted as an insulating means into the diode column. The problem frequently arises in the operation of rectifiers that the load circuitry fed by the rectifier must be protected against excess voltage. The excess voltage may be caused by an excessive rectifier input voltage, or by switching peaks in the load circuitry itself. It has proved to be simple and effective to connect a Zener diode in parallel with the output of the rectifier, the breakdown voltage of the Zener diode being slightly above the maximum permissible direct-current voltage value. In order to accomplish this, a separate component was previously required. Especially in battery-charging systems for motor vehicles, however, it is desirable to avoid additional components, because of their susceptibility to failure and to reduce their susceptibility to failure and to reduce maintenance.

THE INVENTION

It is an object of the invention to provide a diode array having a reduced number of components, and wherein a single component performs several functions. It is a further object to provide a compact diode array whose outer dimensions are small and which is sturdy, so that it is particularly well suited for use in motor vehicles.

In accordance with the invention, a rectifier circuit comprises a plurality of diodes arranged in an array, at least one connection plug for coupling an input AC signal to the rectifier circuit, and an electrically conductive cooling device defining a recess, the cooling device comprising one of the output terminals of the rectifier circuit. At least one positively poled diode and at least one negatively poled diode of the array and an associated connection plug are disposed one above the other in the form of a column and located in the recess of said cooling device. A Zener diode is connected between the output terminals of said rectifier circuit and is in the blocking direction during normal operation of the diodes of the rectifier circuit, the breakdown volage value of said Zener diode being greater than the normal output voltage of the rectifier circuit. Preferably, the Zener diode is connected and located in the column formed by the diodes of the array.

Should the Zener diode which protects the vehicle electrical system be overloaded over a long period of time, or should it fail as a result of a short circuit, then the Zener diode will heat up severely. This heating can be detected with a temperature-sensing component and, in the case of generators having a voltage regulator, this information can be supplied to the regulator. The failure of the Zener diode may be indicated by way of the battery-charging indicator light, for example, and the excitation of the generator can simultaneously be shut off.

DRAWING

DETAILED DESCRIPTION

Figure 1:
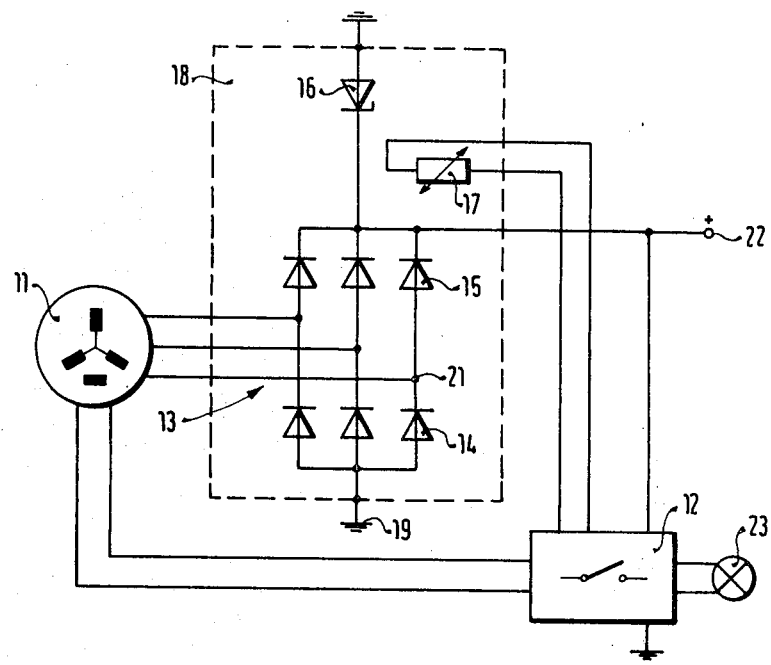
FIG. 1 is a circuit diagram of a diode array according to the invention.

Referring to FIG. 1, a generator 11, shown schematically, is connected to a voltage regulator 12, and alternating-current bridge rectifier circuit 13 is connected to the ouput of generator 11. The rectifier circuit 12 includes three negatively poled diodes 14 and three positively poled diodes 15 connected together in a bridge arrangement. A zener diode 16 is coupled between the commonly connected anodes of diodes 15 and ground. A temperature-sensing element 17, preferably a thermistor is provided to sense the temperature of the Zener diode 16. The entire arrangement of components 13-17 is disposed within a housing 18 which also acts as a heat sink or cooling device. In the exemplary embodiment for use in a vehicle such as an automobile, the housing 18 is electrically connected with the vehicle chassis 19, while mechanically the housing 18 is preferably one part of a bearing plate of the generator 11. The bridge rectifier 13 is switched in a conventional fashion, having three-phase input terminals 21 and a positive output terminal 22. The Zener diode 16 has its cathode coupled to, and preferably in contact with (FIG. 2), the positive output terminal 22, and its anode coupled to and preferably in contact with (FIG. 2), the housing 18. The thermistor 17 is disposed in the immediate vicinity of the positive output terminal 22 and it is operatively connected to the voltage regulator 12.

The breakdown voltage value of the Zener diode 16 is selected to be such that during normal operation of the generator 11 and the rectifier 13, no Zener current will flow. However, if the generator 11 should emit an excess voltage and the voltage at the positive terminal 22 increases beyond a given magnitude, or if voltage peaks should occur in the load circuit which is connected to the positive output terminal 22, then the Zener diode 16 breaks down and cuts off the excess voltage or the voltage peaks. The voltage at the positive output terminal 22 can then increase no further. The value of the Zener voltage of the Zener diode 16 is fixed in accordance with the conditions specified by the intended load on the system. For automotive use using a nominal 12 volt battery the Zener voltage of Zener diode 16 is selected to be 22 volts.

If the Zener diode 16 conducts a Zener current for a relatively long period, then it heats up as a result of its power dissipation. The inherent heat of the Zener diode 16 is first transferred to the positive output terminal 22 and from there to the thermistor 17. As a result, the resistance value of the thermistor 17 changes, and this change in resistance causes the voltage regulator 12 to decrease the effective excitation current to the generator 11. Additionally, the heating up of the Zener diode 16 can be indicated via a monitor light 23 which is operatively coupled to the voltage regulator 12.

The Zener diode 16 between the positive output terminal 22 and the housing 18 acts as an excess-voltage protector. Voltage peaks originating in the generator 11 and the vehicle electrical system are reduced to a harmless level.

Figure 2:
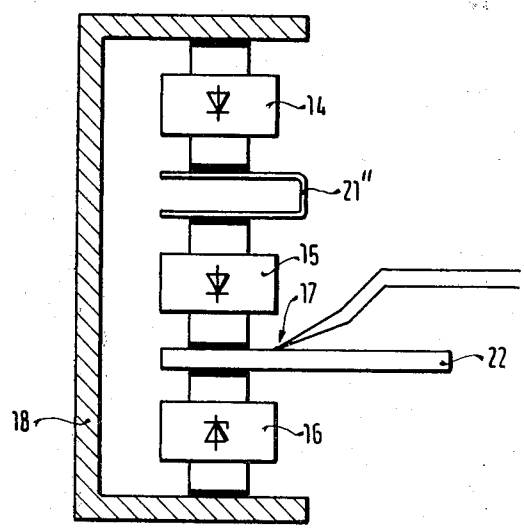
FIG. 2 shows a side sectional view of one exemplary embodiment of the invention.
Figure 3:
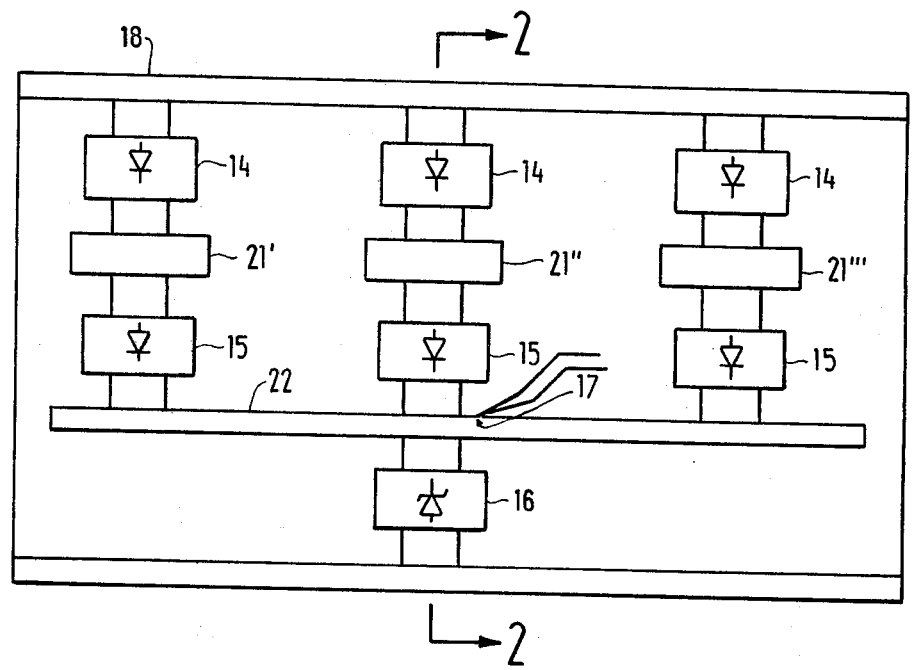
FIG. 3 shows a front view of the embodiment of FIG. 2.

FIGS. 2 and 3 illustrate a physical realization of the diode array according to the invention. The diodes 14, 15 and 16 are stacked in the form of a column in the housing 18, which may, as mentioned above, be a recess in a bearing plate of the generator 11. A negatively oriented diode 14 is disposed with its anode in direct contact with the housing 18. The next element is a three-phase input plug 21', 21", 21''', the input plugs being in the form of a U in order to absorb mechanical stresses caused by heating up of the rectifier circuit 13. A positively oriented diode 15 is disposed with its anode on the other side in contact with the input plug 21 and is followed by the positive output terminal 22 which preferably takes the form of a plate. The thermistor 17 is disposed on the positive output terminal 22. The Zener diode 16 is inserted between the positive output terminal 22 and the side of the housing 18 located opposite the diode 14 with the anode of the Zener diode 16 in contact with the housing 18 in the vicinity of the thermistor 17. When Zener diode 16 heats up, its heat is transferred to output terminal 22 and is sensed by the thermistor 17.

Various changes and modifications may be made within the scope of the inventive concept.

We claim:

1. In a rectifier circuit structure particularly for use in a motor vehicle alternating current generator, comprising a plurality of diodes (14,15) arranged in an array, at least one connection plug (21) for coupling an input AC signal to said rectifier circuit, an electrically conductive cooling device (18) defining a recess, said cooling device (18) comprising a first output terminal of said rectifier circuit, and in which at least one positively poled diode (15) and at least one negatively poled diode (14) and an associated connection plug (21) are disposed one above the other in the form of a column and located in said recess of said cooling device, and a second output terminal (22), comprising in accordance with the invention:

a Zener diode (16) in said column and connected between the output terminals (18,22) of said rectifier circuit and being polarized in the blocking direction during normal operation of said diodes (14,15) of said rectifier circuit, the breakdown voltage value of said Zener diode (16) being greater than the normal output voltage of said rectifier circuit;

said second output terminal (22) of said rectifier circuit being arranged in said column in contact with and between said Zener diode (16) and one of said diodes (15);

an electrode terminal of one of said diodes (14) and the corresponding electrode terminal of said Zener diode (16) being in direct and conductive contact with said cooling device (18); and a temperature-sensing element (17) disposed on said second output terminal (22) for sensing the temperature of said Zener diode (16) and said second output terminal (22).

2. The structure of claim 1, wherein said temperature-sensing element (17) located near said Zener diode (16).

3. The structure of claim 1 or 2, wherein said temperature-sensing element (17) is a thermistor.

4. The structure of claim 1, wherein the breakdown voltage value of said Zener diode (16) is only slightly above a given maximum value for the output voltage of said rectifier circuit structure.

5. The structure of any one of claims 1, 2 or 4, wherein said diode array is a component of an alternating-current bridge rectifier.

6. The structure of claim 1, for use with an automative generator having a voltage regulator, wherein said element (17) is controllably connected with said voltage regulator.

7. The structure of claim 1, wherein said at least one connection plug comprises a U-shaped member having generally opposed legs, said legs being disposed one above the other in said column.

8. The structure of claim 7, wherein said legs are respectively connected to respective diodes of a respective column.

* * * * *